US012681095B2

(12) United States Patent
Arima

(10) Patent No.: US 12,681,095 B2
(45) Date of Patent: Jul. 14, 2026

(54) BATTERY SYSTEM MONITORING DEVICE

(71) Applicant: VEHICLE ENERGY JAPAN INC.,
Hitachinaka (JP)

(72) Inventor: Tomoyuki Arima, Hitachinaka (JP)

(73) Assignee: VEHICLE ENERGY JAPAN INC.,
Hitachinaka (JP)

( * ) Notice: Subject to any disclaimer, the term of this
patent is extended or adjusted under 35
U.S.C. 154(b) by 130 days.

(21) Appl. No.: 18/838,959

(22) PCT Filed: Mar. 31, 2022

(86) PCT No.: PCT/JP2022/016903
§ 371 (c)(1),
(2) Date: Aug. 15, 2024

(87) PCT Pub. No.: WO2023/188397
PCT Pub. Date: Oct. 5, 2023

(65) Prior Publication Data
US 2025/0155510 A1     May 15, 2025

(51) Int. Cl.
*G01R 31/3835*          (2019.01)
*G01R 19/165*           (2006.01)
(Continued)

(52) U.S. Cl.
CPC ....... *G01R 31/3835* (2019.01); *G01R 31/396*
(2019.01)

(58) Field of Classification Search
CPC ...... G01R 31/36; G01R 31/374; G01R 31/38;
G01R 31/382; G01R 31/39;
(Continued)

(56) References Cited

U.S. PATENT DOCUMENTS

2013/0214791 A1     8/2013  Okaniwa et al.
2014/0167778 A1     6/2014  Todani et al.
(Continued)

FOREIGN PATENT DOCUMENTS

JP      2014-121231 A     6/2014
JP      2015-203593 A    11/2015
JP      2020-010562 A     1/2020

OTHER PUBLICATIONS

Notice of Reasons for Refusal dated Jun. 3, 2025 issued in JP
Application No. 2024-511134, with English translation, 6 pages.
(Continued)

*Primary Examiner* — Neel D Shah
(74) *Attorney, Agent, or Firm* — FOLEY & LARDNER
LLP

(57) ABSTRACT

A battery system monitoring device removes a first noise
contained in a voltage of a group of single cells which are
connected in series based on a first time constant, and
removes a second noise contained in a series voltage
between the positive electrode of the highest single cell and
the negative electrode of the lowest single cell based on a
second time constant. A total voltage is calculated by total-
ing the voltage of the single cells where the first noise has
been removed. The series voltage where the second noise
has been removed is measured. Based on the calculated total
voltage and the measured series voltage, a determination
regarding whether or not to permit a diagnosis of a state of
the group of single cells is made. The diagnosis is executed
in response to a determination that the diagnosis may be
performed.

5 Claims, 6 Drawing Sheets

(51) Int. Cl.
G01R 31/36 (2020.01)
G01R 31/396 (2019.01)

(58) Field of Classification Search
CPC .......................... G01R 31/3835; G01R 31/392;
G01R 31/396; G01R 19/165
See application file for complete search history.

(56) References Cited

U.S. PATENT DOCUMENTS

| | | | | |
|---|---|---|---|---|
| 2017/0030976 A1* | 2/2017 | Suzuki | ................. | G01R 31/389 |
| 2019/0285669 A1 | 9/2019 | Furukawa | | |

OTHER PUBLICATIONS

International Search Report dated Jun. 14, 2022 issued in International Application No. PCT/JP2022/016903, with English translation, 4 pages.
Extended European Search Report dated Apr. 11, 2025 issued in EP Application No. 22935535.9, 7 pages.

\* cited by examiner

BATTERY SYSTEM MONITORING DEVICE

CROSS-REFERENCE TO RELATED PATENT APPLICATION

This application is a National Stage filing of International Application No. PCT/JP2022/016903, filed on Mar. 31, 2022, the entire disclosure of which is hereby incorporated by reference herein.

TECHNICAL FIELD

The present disclosure relates to a battery system monitoring device.

BACKGROUND ART

In a hybrid electric vehicle (HEV), an electric vehicle (EV), and the like, in order to ensure a desired high voltage, there is used a battery pack (battery system) where a number of single cells of the secondary battery are connected in series. In such battery pack, calculation of the capacity of each single cell and protection management are executed using an integrated circuit. The integrated circuit executes, for example, measurement of the cell voltage (a voltage between the terminals of the single cell) and equalization of the charging state namely the remaining capacity (balancing discharging). Furthermore, various kinds of diagnoses of the single cell and the self-controller are also executed, and reliability and safety of the battery pack are improved (Patent Literature 1 for example).

CITATION LIST

Patent Literature

Patent Literature 1: Japanese Unexamined Patent Application Publication No. 2015-203593

SUMMARY

Technical Problem

In order to further improve reliability and safety of the battery pack, it is important to improve accuracy of diagnosis by the integrated circuit. As a result of intensive researches, the present applicant found out that diagnosis accuracy of the integrated circuit could be improved by considering possibility of application of a noise superposed on the cell voltage.

The object of the present disclosure is to provide a battery system monitoring device capable of improving diagnosis accuracy of an integrated circuit.

Solution to Problem

A battery system monitoring device of the present disclosure solving the problem described above is a battery system monitoring device monitoring a state of a plural number of single cells connected in series, the battery system monitoring device including a first noise removal unit removing first noise contained in a voltage of the plural number of single cells on the basis of a first time constant, a total voltage calculation unit calculating a total voltage by totaling the voltage of the plural number of single cells where the first noise has been removed by the first noise removal unit, a second noise removal unit removing second noise contained in a series voltage that is a voltage between a positive electrode of the highest single cell connected in series of the plural number of single cells and a negative electrode of the lowest single cell on the basis of a second time constant, a series voltage measurement unit measuring the series voltage where the second noise has been removed by the second noise removal unit, a diagnosis permission determination unit determining whether or not diagnosis of a state of the plural number of single cells is to be permitted on the basis of the total voltage calculated by the total voltage calculation unit and the series voltage measured by the series voltage measurement unit, and a cell monitoring diagnosis unit executing diagnosis of a state of the plural number of single cells when it has been determined that the diagnosis may be executed by the diagnosis permission determination unit.

Advantageous Effects

According to the battery system monitoring device by the present disclosure, diagnosis accuracy of an integrated circuit can be improved. Further features related to the present disclosure are to be clarified by the written content of the present description and the attached drawings. Also, problems, configurations, and effects other than those described above will be clarified by explanation of the embodiments described below.

DESCRIPTION OF EMBODIMENTS

Figure 1:
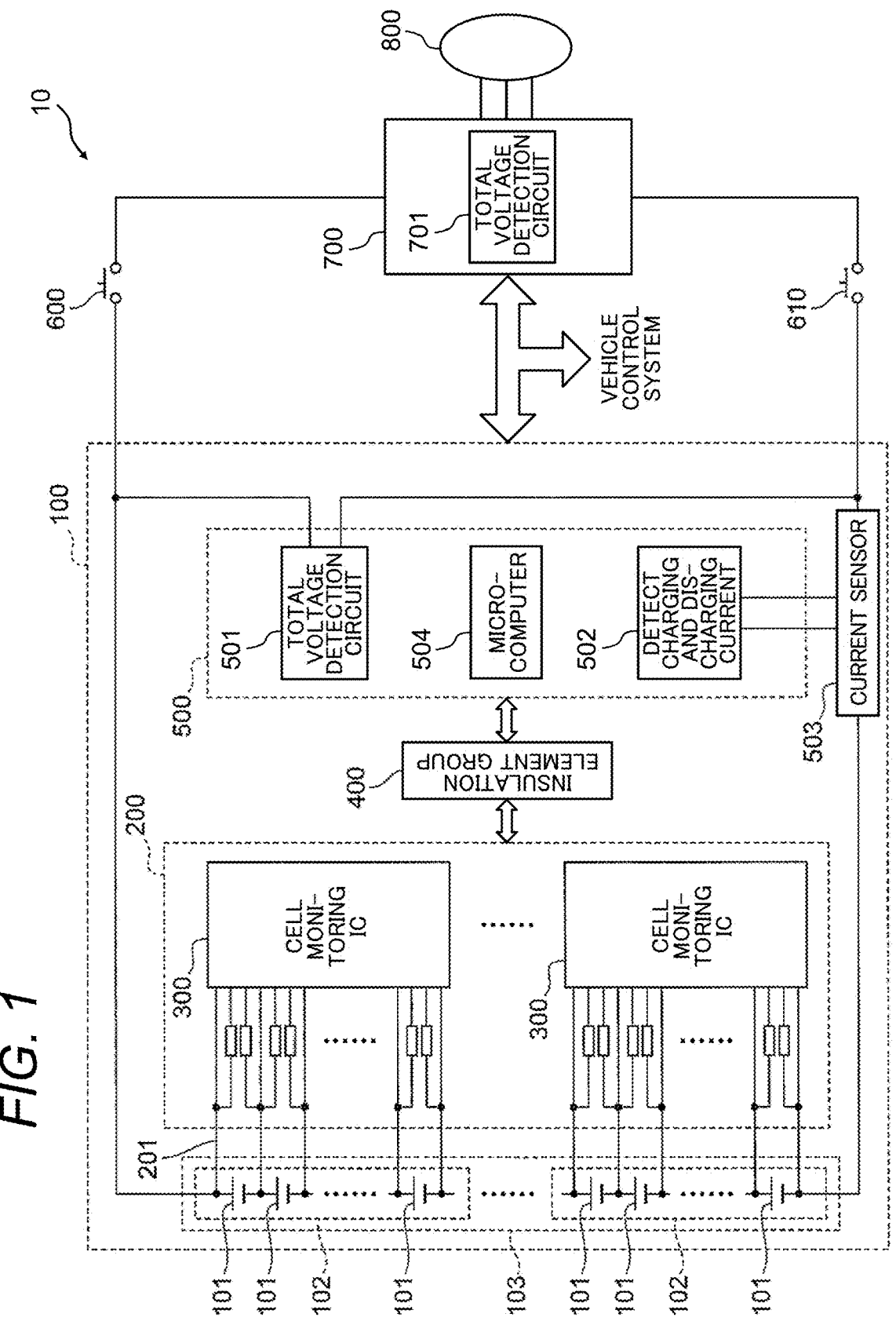
FIG. 1 is a drawing illustrating a configuration example of a hybrid electric vehicle provided with a battery system including a battery system monitoring device of the present disclosure.

Embodiments of the present disclosure will be hereinafter explained referring to the drawings.

First Embodiment

The present embodiment is an example of a case of applying a battery system monitoring device related to the present disclosure to a drive system used for a hybrid electric vehicle (HEV) and the like. Also, the present disclosure can be applied widely to various kinds of drive systems mounded on not only HEV but also a plug-in hybrid electric vehicle (PHEV), an electric vehicle (EV), a railway vehicle, and the like.

In embodiments described below, as a power storage and discharging device becoming a minimum unit for control, although a lithium ion battery whose voltage is in a range of 3.0 to 4.2 V (average output voltage: 3.6 V) is assumed, the power storage and discharging device is not limited to it and can alternatively be such device capable of storing and discharging electricity that usage is restricted when SOC (state of charge) expressing the charging state is excessively high (over-charging) and excessively low (over-discharging), and they are collectively referred here to as a single cell or a cell.

According to the present embodiment, one obtained by connecting plural number (generally more than several numbers and less than 20 pieces) of single cells in series is referred to as a cell group, and one obtained by connecting plural number of the cell groups in series is referred to as a battery module. Also, one obtained by connecting these cell groups or battery modules by plural numbers in series or in parallel is referred to as a battery pack. In each cell group, a cell monitoring IC is arranged respectively. The cell monitoring IC detects the cell voltage of each single cell, and monitors and controls the battery state while executing balancing discharging and the like for equalizing each cell voltage.

<HEV Drive System>

FIG. 1 is a drawing illustrating a configuration example of an HEV drive system 10 including a battery system monitoring device 100 of the present disclosure.

The HEV drive system 10 includes the battery system monitoring device 100, an inverter 700 connected to the battery system monitoring device 100, and a motor 800 connected to the inverter 700. The battery system monitoring device 100 is connected to the inverter 700 through relays 600, 610. At the time a vehicle is to be started and accelerated, the power discharged from the battery system monitoring device 100 is supplied to the motor 800 through the inverter 700, and assists an engine not illustrated of the HEV 10. At the time the vehicle is to be decelerated and stopped, the regenerated power from the motor 800 is supplied and charged to the battery system monitoring device 100 though the inverter 700.

Further, here, although the inverter 700 includes an inverter circuit including a plural number of semiconductor switching elements, a gate drive circuit for the semiconductor switching element, and a motor controller generating a pulse signal that PWM-controls the gate drive circuit, the inverter circuit, the gate drive circuit, and the motor controller are omitted in FIG. 1.

The battery system monitoring device 100 mainly includes a battery pack 103 configured of a plural number of single cells 101 which are lithium ion batteries, the cell controller 200 including a plural number of cell monitoring ICs 300 for monitoring and controlling battery, the cell monitoring IC 300 detecting the cell voltage of each single cell 101 for each cell group 102 of the battery pack 103 and executing balancing discharging operation and the like, and a battery controller 500 controlling operation of the cell controller 200 and executing state determination of each single cell 101.

In an example of the battery system monitoring device 100 expressed in the present embodiment, a lithium ion battery whose rated capacity is 5.5 Ah is made the single cell 101, and the battery system monitoring device 100 includes the battery pack 103 where 96 pieces of the single cell 101 are connected in series. The battery controller 500 executes communication with a plural number of the cell monitoring ICs 300 through an insulation element group 400, and controls the battery pack 103. The battery pack 103 includes a plural number of the cell group 102. The cell monitoring IC 300 is arranged in each cell group 102 as described above.

The cell controller 200 uses these plural number of the cell monitoring ICs 300, and functions as a battery managing device executing management of the battery pack 103. The battery pack 103 and the cell controller 200 are connected to each other through a cell voltage detection and discharge line 201.

The battery controller 500 controls discharging of the plural number of the single cells 101 in balancing the charging state of the plural number of the single cells 101. The battery controller 500 includes a total voltage detection circuit 501, a charging and discharging current detection circuit 502, and a microcomputer 504. The total voltage detection circuit 501 measures the total voltage of the battery pack 103. The charging and discharging current detection circuit 502 is connected to a current sensor 503, and detects the charging and discharging current flowing through the battery pack 103 on the basis of a detection signal of the current sensor 503. The microcomputer 504 executes communication with the cell controller 200, the inverter 700, and a superordinate vehicle controller (not illustrated) such as a vehicle control system not illustrated, and controls the total of the battery controller 500. Also, the total voltage detection circuit 501 only has to be capable of measuring the total voltage of the battery pack 103, and may not be arranged within the battery controller 500 as FIG. 1.

A total voltage detection circuit 701 detecting the total voltage of the battery pack 103 is also arranged within the inverter 700. Further, although it is not illustrated in FIG. 1, the battery controller 500 executes temperature correction of a parameter of the battery state on the basis of the temperature of the single cell 101 measured by a temperature detection circuit connected to the cell monitoring IC 300.

Further, although it is not illustrated in FIG. 1, the cell controller 200 and the battery controller 500 are arranged on one substrate, and they are stored in a case made of metal. Also, the battery pack 103 is also stored in a case made of metal. The cell controller 200 and the battery pack 103 are connected by a harness where a plural number of the voltage detection lines, the connection lines of the temperature sensor (not illustrated) of the single cell 101, and the like are bundled.

According to this battery system monitoring device 100, operations described below are executed after the start-up. The battery controller 500 transmits a command to execute measurement of OCV (open circuit voltage) of each single cell 101 to the cell controller 200. Transmission of the command from the battery controller 500 to the cell controller 200 is executed through the insulation element group 400. In accordance with this command, in the cell controller 200, measurement of OCV of each single cell 101 is executed. Also, data of OCV of each single cell 101 measured by the cell controller 200 are transmitted from the cell controller 200 to the battery controller 500 in a unit of the cell group. Data transmission from the cell controller 200 to the battery controller 500 is also executed through the insulation element group 400.

The battery controller 500 converts OCV of each single cell 101 having been received into SOC, and calculates the deviation of SOC of each single cell 101. Out of the plural number of the single cells 101, the single cell 101 whose deviation of SOC is greater than a predetermined value becomes an object for executing balancing discharging. Also, time required until the deviation of SOC of the single cell 101 that has become the object of balancing discharging becomes zero is calculated. Also, a command to execute a control operation to turn on a cell discharging switch 321 of the single cell 101 having become the object of balancing discharging for this time is transmitted from the battery controller 500 to the cell controller 200. In accordance with this command, in the cell controller 200, the cell discharging switch 321 of the single cell 101 of the object of balancing discharging is controlled to be turned on, and discharging of the single cell 101 of the object of balancing is executed.

After calculating SOC of the battery pack 103 from OCV of each single cell 101 having been measured as described above, the inverter 700 or the superordinate vehicle controller turns on the relay 600 and the relay 610, and the battery system monitoring device 100 is connected to the inverter 700. Also, when the inverter 700 receives the charging and discharging command that is from the superordinate vehicle controller, the inverter 700 is operated to drive the motor 800, and charging and discharging operation of the battery system monitoring device 100 is executed.

From the time when the battery system monitoring device 100 starts charging and discharging with the relay 600 and the relay 610 being turned on, the battery controller 500 measures the total voltage and the charging and discharging current at every constant time using the total voltage detection circuit 501 and the charging and discharging current detection circuit 502. From the values of the total voltage and the charging and discharging current having been acquired, the battery controller 500 calculates the charging state (SOC) and the internal resistance (DCR) of the battery pack 103 on a real time basis. Also, the current or the power the battery pack 103 can charge and discharge are calculated from these values on a real time basis, and are transmitted to the inverter 700. The inverter 700 controls the charging and discharging current or the power within a range of the current or the power having been transmitted.

Figure 2:
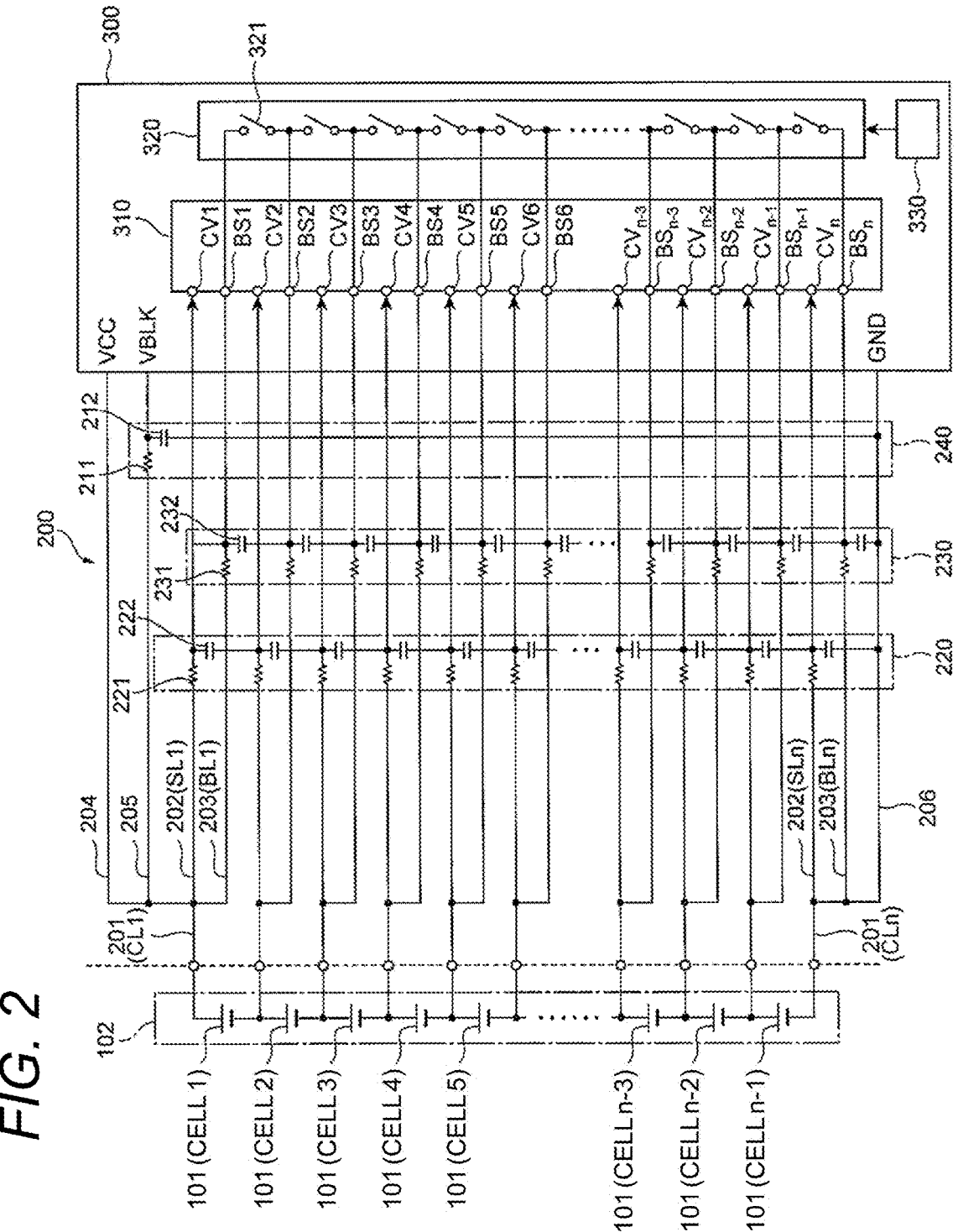
FIG. 2 is a drawing illustrating a configuration of a self-controller 200 of FIG. 1.

FIG. 2 is an explanatory drawing illustrating an internal configuration of the self-controller 200.

In FIG. 2, there are illustrated one cell group 102, and the cell monitoring IC 300 corresponding to the cell group 102. Each cell group 102 is configured by connecting n−1 number of piece (n is an integer) of the single cells 101 (made to be cell 1 to cell n−1) in series.

The cell group 102 and the cell monitoring IC 300 controlling the cell group 102 are connected to each other through n pieces of the cell voltage detection and discharge line 201 (CL1 to CLn). With respect to n pieces of the cell voltage detection and discharge line 201 (CL1 to CLn), the single cell 101 side is connected to the positive electrode terminal and the negative electrode terminal of each single cell 101 of the battery pack 103. Also, the cell monitoring IC side is divided into n pieces of cell voltage detection lines 202 (SL1 to SLn) and n pieces of cell voltage discharge lines 203 (BL1 to BLn) respectively. Each of the cell voltage detection lines 202 (SL1 to SLn) is connected to a CV terminal (CV1 to CVn) for voltage detection of the cell monitoring IC 300 through a cell input resistance Rcv 221. Between the CV terminals of the cell monitoring IC 300, a cell input condenser Ccv 222 is connected. The cell input condenser Ccv 222 is a bypass condenser arranged for noise control measures. The cell input condenser Ccv 222 is for preventing erroneous diagnosis of diagnosis of the cell monitoring IC (the detail is omitted), and it is configured to prevent erroneous detection of the noise such as the ripple voltage attributable to the operation of the inverter 700.

Also, the cell voltage discharge lines 203 (BL1 to BLn) for balancing operation are connected to BS terminals (BS1 to BSn) of the cell monitoring IC 300 through balancing resistances Rbs 231. Between the BS terminals of the cell monitoring IC 300, a balancing condenser Cbs 232 is connected. The balancing condenser Cbs 232 is a bypass condenser arranged for noise control measures. The balancing condenser Cbs 232 is for preventing erroneous diagnosis of diagnosis of the cell monitoring IC (the detail is omitted), and it is configured to prevent erroneous detection caused by the noise such as the ripple voltage attributable to the operation of the inverter 700.

The cell controller 200 includes the cell voltage detection line RC filter circuit 220, a cell voltage discharge line RC filter circuit 230, and the VBLK voltage line RC filter circuit 240. The cell voltage detection line RC filter circuit 220 is arranged between the branch point of the cell voltage detection lines 202 (SL1 to SLn) and the cell voltage discharge lines 203 (BL1 to BLn) and the cell monitoring IC 300 in the cell voltage detection lines 202 (SL1 to SLn). The cell voltage detection line RC filter circuit 220 is for removing a high frequency noise superposed on a voltage signal of each single cell 101 inputted from the cell voltage detection lines 202 (SL1 to SLn) to the cell monitoring IC 300, and is configured of an RC filter that includes the cell input resistance Rcv 221 and the cell input condenser Ccv 222. The cell voltage detection line RC filter circuit 220 has a first time constant. The cell voltage detection line RC filter circuit 220 configures a first noise removal unit that removes the first noise contained in the cell voltage of the plural number of the single cells 101 on the basis of the first time constant.

The cell voltage discharge line RC filter circuit 230 is configured of an RC filter that includes the balancing resistance Rbs 231 and the balancing condenser Cbs 232. The balancing resistances Rbs 231 are resistance elements for controlling the cell discharging current flowing through the cell voltage discharge lines 203 (BL1 to BLn) at the time of discharging, and are arranged respectively between the branch point of the cell voltage detection lines 202 (SL1 to SLn) and the cell voltage discharge lines 203 (BL1 to BLn) and the cell monitoring IC 300 in the cell voltage discharge lines 203 (BL1 to BLn).

The VBLK voltage line RC filter circuit 240 is for removing a noise superposed on the VBLK voltage of a VBLK voltage line 205, and is configured of an RC filter that includes a VBLK voltage line input resistance 211 and a VBLK voltage line input condenser 212. The VBLK voltage line RC filter circuit 240 has a second time constant that is different from the first time constant of the cell voltage detection line RC filter circuit 220.

The VBLK voltage line input resistance 211 of the VBLK voltage line RC filter circuit 240 is arranged in the VBLK voltage line 205. With respect to the VBLK voltage line 205, one end is connected to the positive electrode side of the single cell 101 that is disposed at the highest level namely on the highest potential side of the cell group 102, and the other end is connected to the VBLK terminal of the cell monitoring IC 300. The VBLK voltage line 205 is used for measuring the voltage (VBLK voltage) of the entire cell group where all of the single cells 101 configuring the cell group 102 are connected in series. With respect to the VBLK voltage line input condenser 212, one end is connected to the VBLK voltage line 205, and the other end is connected to a GND line GL 206. The VBLK voltage line RC filter circuit 240 configures the second noise removal unit removing the second noise contained in the VBLK voltage that is a series voltage between the positive electrode of the highest single cell 101 of the plural number of the single cells 101 connected in series and the negative electrode of the lowest single cell 101 on the basis of the second time constant.

The cell monitoring IC 300 (e.g., processing circuitry, etc.) includes a cell voltage detection unit 310, a balancing switch circuit 320, and a cell discharging control unit 330. The cell voltage detection unit 310 respectively detects the cell voltage of each of the single cells 101 by n pieces of the cell voltage detection lines 202 (SL1 to SLn). The balancing switch circuit 320 includes a plural number of the cell discharging switches 321 connected to the BS terminals (BS1 to BSn) of the cell monitoring IC 300. The cell discharging switch 321 allows the cell discharging current of a cell in question to flow from the cell voltage discharge lines 203 (BL1 to BLn) through the balancing resistance Rbs 231 by being turned on. The cell discharging control unit 330 controls the cell discharging switch 321 corresponding to the single cell 101 of the discharging object out of the cell voltage discharge lines 203 (BL1 to BLn).

The power supply terminal VCC of the cell monitoring IC 300 is connected to the positive electrode side of the single cell 101 disposed at the highest level namely on the highest potential side of the cell group 102 by a power supply line PL 204 of the cell monitoring IC 300. The GND terminal of the cell monitoring IC 300 is connected to the negative electrode side of the single cell 101 disposed at the lowest level namely on the lowest potential side of the cell group 102 by a GND line GL 206 of the cell monitoring IC 300.

Further, although such example is illustrated in FIG. 2 that n−1 pieces of the single cells 101 are connected in series in the battery pack 103, the configuration of the battery pack 103 may be other configurations such that those obtained by connecting the battery cells in parallel are connected in series, and the number of piece of the battery cell is not limited.

The cell monitoring IC 300 having the configuration described above detects the cell voltage of each single cell 101 by n pieces of the cell voltage detection lines 202 (SL1 to SLn) branched from n pieces of the cell voltage detection and discharge line 201 (CL1 to CLn). The cell monitoring IC 300 detects the cell voltage of each single cell 101 where the first noise has been removed by the cell voltage detection line RC filter circuit 220. Also, the cell monitoring IC 300 detects the discharging voltage of each single cell 101 by n pieces of the cell voltage discharge lines 203 (BL1 to BLn) branched from n pieces of the cell voltage detection and discharge line 201 (CL1 to CLn). The cell monitoring IC 300 detects the discharging voltage of each single cell 101 where the second noise has been removed by the cell voltage discharge line RC filter circuit 230.

The battery system monitoring device 100 executes a predetermined operation for controlling and monitoring the battery pack 103 on the basis of the voltage detection result of each single cell 101 by the cell monitoring IC 300. For example, when the charging state (SOC) of each single cell 101 is estimated and there is scattering in the charging state among respective single cells 101, a cell discharging switch 321 corresponding to the single cell 101 of the object of discharging out of the cell voltage discharge lines 203 (BL1 to BLn) is controlled to be turned on. Also, by allowing the cell discharging current to flow by way of the cell voltage discharge lines 203, discharging for equalizing the charging state of each single cell 101 is executed. Other than the above, the battery system monitoring device 100 executes various processes and controls on the basis of the cell voltage of each single cell 101 detected by the cell monitoring IC 300.

The cell voltage detection line RC filter circuit 220 suppresses a noise mainly of the ripple voltage superposed on the cell voltage caused by operation of the inverter 700. The voltage terminals in both ends of the single cell 101 are connected to the BS terminals of the cell monitoring IC 300 through the balancing resistance Rbs 231. When the cell discharging switch 321 is turned on, the cell discharging current of a single cell 101 in question flows and is discharged through the balancing resistance Rbs 231.

Although it is not illustrated, the CV terminal is connected to the input terminal of a multiplexer in the inside of the cell monitoring IC 300. The multiplexer selects a single cell 101 of each and outputs the positive electrode potential and the negative electrode potential of the single cell 101, and is controlled by an output from a multiplexer input selection register of a logic unit. An output of the multiplexer is converted to voltage between terminals of each single cell 101 through a differential amplifier, and the voltage is converted to a digital value by an AD converter. Operation of the AD converter is controlled by the logic unit, and the output of the AD converter is processed by the logic unit. That is to say, the voltage is measured by the differential amplifier and the AD converter.

For this AD converter, a high-speed AD converter such as the successive approximation type is employed for example. By using such high-speed AD converter, it is possible to execute diagnosis of the multiplexer (the detail is omitted) and so on fast.

When a signal contains a noise component, a high-speed AD converter detects and AD-coverts the signal as it is. Therefore, according to the present embodiment, the RC filter is configured to arrange the cell input resistance Rcv 221 and the cell input condenser Ccv 222 in each of the cell voltage detection lines 202 connected to the CV terminal for measuring the voltage between terminals. Also, it is configured to be inputted to the AD converter through the multiplexer and the differential amplifier within the cell monitoring IC after removing the noise by the RC filter. Therefore, even when a high frequency ripple noise superposed to the cell voltage caused by operation of the inverter 700 may be applied for example, it is possible to remove the high frequency ripple noise and to suppress an impact to diagnosis executed by the cell monitoring IC 300.

For example, it is configured that the cutoff frequency of the RC filter of the CV terminal becomes approximately 50 Hz. Thus, the noise (approximately 20% and approximately 20 kHz in terms of p-p) by switching of the semiconductor switching element of the inverter 700 can be reduced to equal to or less than $\frac{1}{100}$. Since the time constant of the cell voltage discharge line RC filter circuit 230 configured of the balancing resistance Rbs 231 and the balancing condenser Cbs 232 is small, wire breakage determination in balancing current detection (the detail is omitted) can be executed fast.

With respect to the cell controller 200 of the present embodiment, the cell voltage detection line RC filter circuit 220 of the cell voltage detection line 202 and the VBLK voltage line RC filter circuit 240 of the VBLK voltage line 205 have time constants (the first time constant and the second time constant) different from each other.

When a filter circuit is configured of an RC filter, the time constant and the cutoff frequency are expressed by expressions (1) and (2) described below.

$$\text{Time Constant } \tau = R \times C \qquad (1)$$

$$\text{Cutoff frequency } fc = 1/(2 \cdot \pi \cdot \tau) = 1/(2 \cdot \pi \cdot R \cdot C) \qquad (2)$$

For example, when the ripple noise whose ripple noise frequency fnoise is 1 kHz is applied to the circuit, the cutoff frequency fc (Cn) by the cell voltage detection line RC filter circuit 220 of the cell voltage detection line 202 is set to several tens kHz, and the cutoff frequency fc (VBLK) by the VBLK voltage line RC filter circuit 240 of the VBLK voltage line 205 is set to approximately several hundreds Hz.

The relation of the frequency can be stated as the expression (3) described below.

$$fc\ (Cn) > fnoise > fc\ (VBLK) \qquad (3)$$

Since the cutoff frequency fc (Cn) by the cell voltage detection line RC filter circuit 220 of the cell voltage detection line 202 is greater than the ripple noise frequency fnoise, attenuation of the ripple noise is less, and the cell voltage of the rear stage of the RC filter (the rear stage of the cell voltage detection line RC filter circuit 220) measured by the cell monitoring IC 300 becomes a measured voltage where the ripple noise is superposed.

On the other hand, since the cutoff frequency fc (VBLK) by the VBLK voltage line RC filter circuit 240 of the VBLK voltage line 205 is lower than the ripple noise frequency fnoise, the ripple noise is attenuated sufficiently, and the measured value of the VBLK voltage of the rear stage of the RC filter (the rear stage of the VBLK voltage line RC filter circuit 240) by the cell monitoring IC 300 becomes a measured voltage where the ripple noise is removed.

When the difference ΔV of the cell total voltage that is the total of the cell voltage of each single cell 101 (from the cell 1 to the cell n−1) obtained in the cell monitoring IC 300 and the VBLK voltage is acquired as the expression (4), although the noise is removed from the VBLK voltage, since the ripple noise superposes the cell voltage, a big difference is caused.

$$|VBLK \text{ voltage} - \text{cell total voltage}| = \Delta V \qquad (4)$$

For example, when the ripple noise whose ripple noise frequency fnoise is 20 kHz is applied to the circuit, the cutoff frequency fc (Cn) by the cell voltage detection line RC filter circuit 220 of the cell voltage detection line 202 is set to several tens kHz, and the cutoff frequency fc (VBLK) by the VBLK voltage line RC filter circuit 240 of the VBLK voltage line 205 is set to several hundreds Hz.

The relation of the frequency can be stated as the expression (5) described below.

$$fc\ (noise) > fc\ (Cn) > fc\ (VBLK) \qquad (5)$$

Since the cutoff frequency fc (Cn) of the cell voltage detection line 202 is lower than the ripple noise frequency fnoise, the ripple noise is attenuated sufficiently, and the cell voltage of the rear stage of the RC filter (the rear stage of the cell voltage detection line RC filter circuit 220) measured by the cell monitoring IC 300 becomes a measured voltage where the ripple noise is removed.

On the other hand, since the cutoff frequency fc (VBLK) of the RC filter of the VBLK voltage line 205 is lower than the ripple noise frequency fnoise, the ripple noise is attenuated sufficiently, and the measured value of the VBLK voltage of the rear stage of the RC filter (the rear stage of the VBLK voltage line RC filter circuit 240) by the cell monitoring IC 300 becomes a measured voltage where the ripple noise is removed.

When the difference ΔV of the cell total voltage that is the total of the cell voltage of each single cell 101 (from the cell 1 to the cell n−1) obtained by the cell monitoring IC 300 and the VBLK voltage is acquired as the expression (4), since the noise is removed from both of the cell total voltage and the VBLK voltage, the difference ΔV becomes small.

From the above, although the difference of the cell total voltage and the VBLK voltage value is large when the ripple noise with low frequency for example is applied to the circuit, the difference of the cell total voltage and the VBLK voltage value is small when the ripple noise with high frequency is applied to the circuit by the difference of the cutoff frequency of the cell voltage detection line 202 and the cutoff frequency of the VBLK voltage line 205. Thus, by executing the noise removal process of the cell total voltage and the VBLK voltage using the RC filter circuits whose time constant is different from each other and acquiring the difference ΔV of the cell total voltage and the VBLK voltage of the time after the noise removal process, presence and absence of the low frequency ripple noise can be detected.

Explanation will be made using the graph of FIG. 7.

Figure 7:
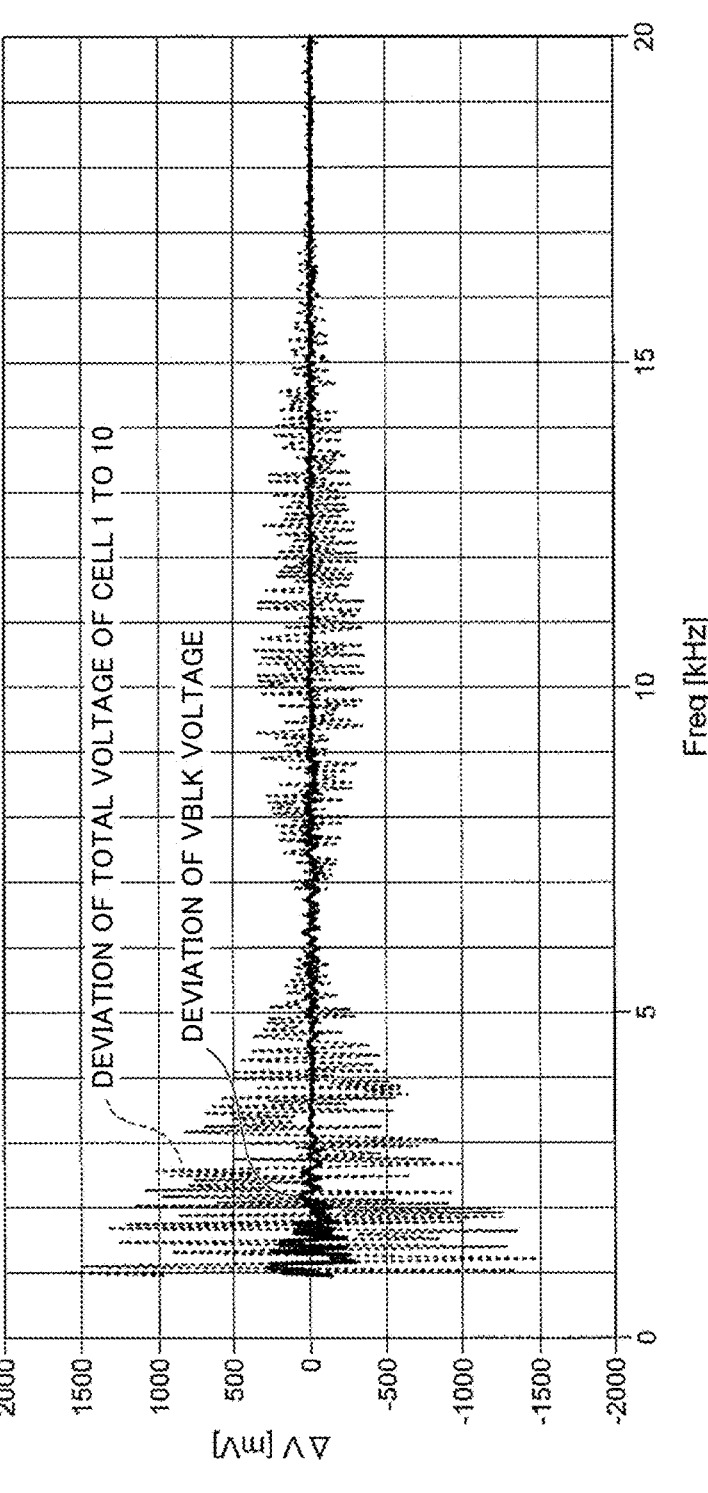
FIG. 7 is a graph illustrating difference $\Delta V$ of each voltage of the cell total voltage and the VBLK voltage according to the presence and absence of the ripple noise.

FIG. 7 is a graph illustrating the deviation of the cell total voltage of the cell 1 to the cell 10 when there is the ripple noise and when there is not the ripple noise and the deviation of the VBLK voltage when there is the ripple noise and when there is not the ripple noise in the battery system monitoring device using 10 pieces of the single cell 101. In an example illustrated in FIG. 7, there is illustrated the deviation of the measurement result of the voltage of the rear stage of the RC filter measured by the cell monitoring IC 300 of the cell total voltage of the cell 1 to the cell 10 and the VBLK voltage when there is not the ripple noise and the measurement result of the voltage of the rear stage of the RC filter measured by the cell monitoring IC 300 of the cell total voltage of the cell 1 to the cell 10 and the VBLK voltage when the ripple noise is applied from 1 kHz to 20 kHz. In the graph of FIG. 7, the horizontal axis expresses the frequency of the ripple noise, and the vertical axis expresses the difference ΔV of respective voltages of the cell total voltage and the VBLK voltage when the ripple noise is applied and when the ripple noise is not applied.

The cutoff frequency fc (Cn) by the cell voltage detection line RC filter circuit 220 of the cell voltage detection line 202 is set to several tens kHz, and the cutoff frequency fc (VBLK) of the RC filter of the VBLK voltage line 205 is set to several hundreds Hz.

In the vicinity of 1 kHz of the ripple noise, the deviation of the cell total voltage is as large as ±1500 mV because of fc(Cn)>fnoise, and the deviation of the VBLK voltage is as small as ±300 mV because of fnoise>fc(VBLK).

In the vicinity of 20 kHz of the ripple noise, the deviation of the cell total voltage is as small as ±50 mV or less because of fc(noise)>fc(Cn), and the deviation of the VBLK voltage is also as small as ±50 mV or less because of fc(noise)>fc (VBLK).

Figure 8:
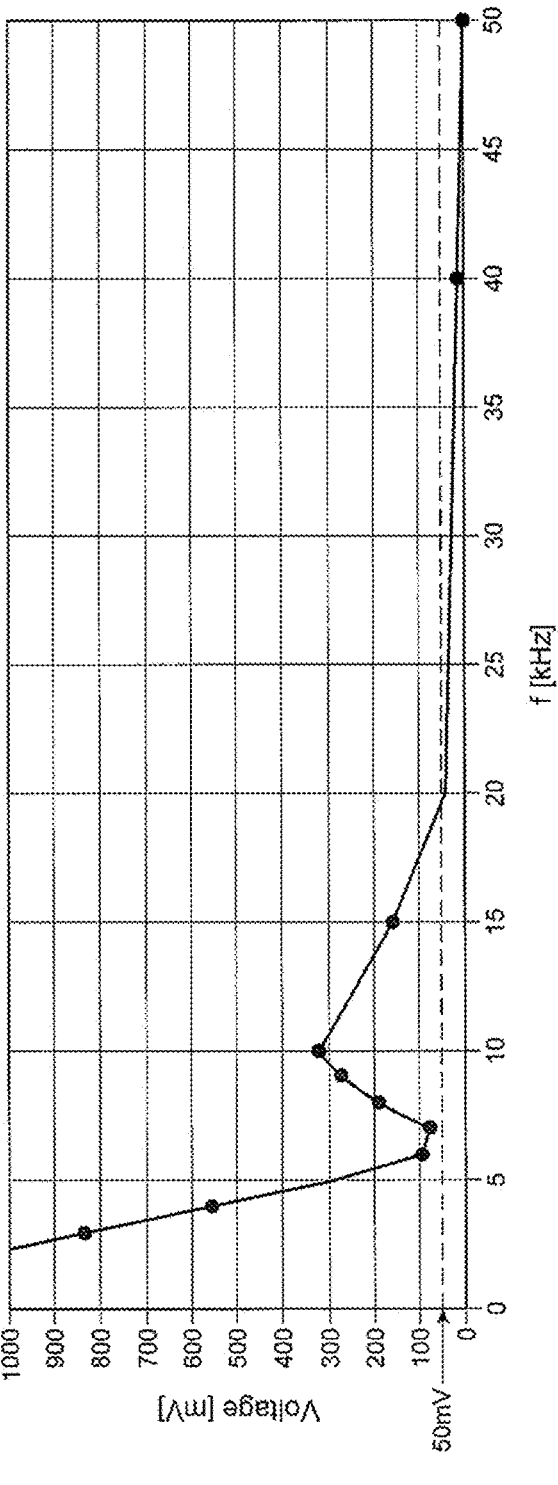
FIG. 8 is a graph illustrating the difference of the cell total voltage and the VBLK voltage.

FIG. 8 becomes a result of calculation of the difference of the cell total voltage and the VBLK voltage. The horizontal axis of FIG. 8 becomes the difference of the deviation of the cell total voltage and the deviation of the VBLK voltage of FIG. 7.

As illustrated in FIG. 8, the difference of the deviation of the cell total voltage and the deviation of the VBLK voltage is as large as 1000 mV or more in the vicinity of 1 kHz of the ripple noise, and is as small as 50 mV or below in the vicinity of 20 kHz of the ripple noise. Therefore, when the difference ΔV of the cell total voltage and the VBLK voltage is large, it can be determined that a low frequency ripple noise has been applied to the circuit. Thus, by acquiring the difference ΔV of the cell total voltage and the VBLK voltage, presence and absence of the low frequency ripple noise can be detected.

Next, explanation will be made on a process for determining whether or not diagnosis is to be executed in the cell monitoring IC.

The cell monitoring IC 300 improves reliability and safety of the own by executing not only measurement and equalization of the cell voltage but also various diagnoses of the communication, internal power supply of IC, and internal circuit of IC. The cell monitoring IC 300 determines whether or not the low frequency ripple noise has been applied before executing the diagnosis. Also, the diagnosis is executed when it is determined that the low frequency ripple noise has not been applied, and the diagnosis is not executed assuming that there is a risk of erroneous diagnosis when it is determined that the low frequency ripple noise has been applied.

Figure 3:
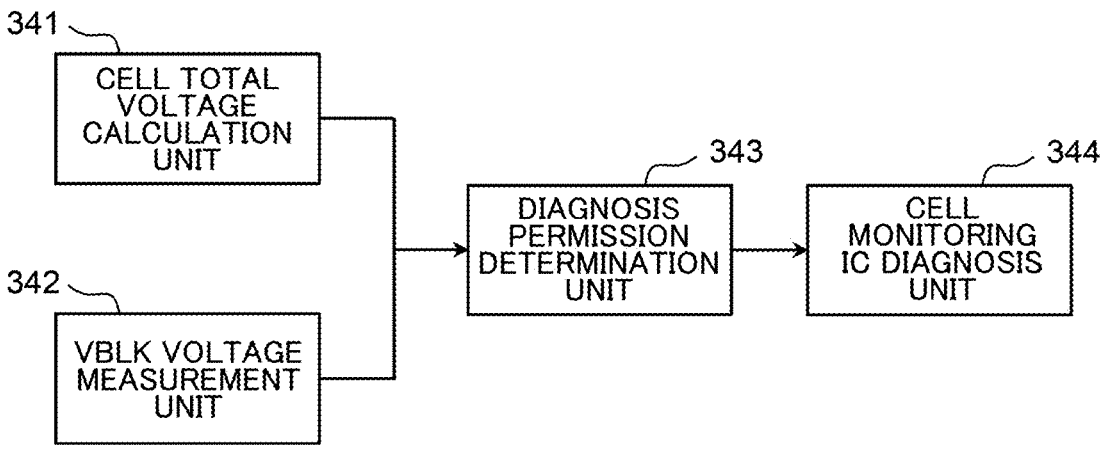
FIG. 3 is a function block diagram explaining the internal function of a cell monitoring IC.
Figure 4:
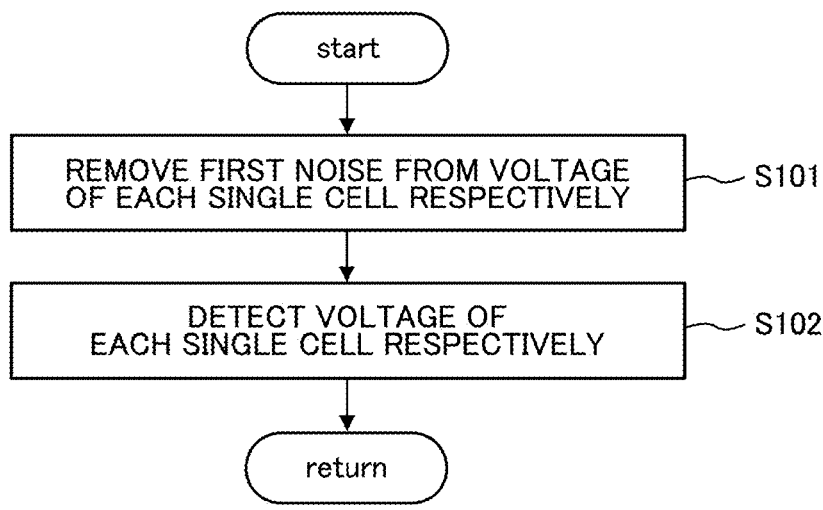
FIG. 4 is a flowchart explaining a process content of noise removal by a cell voltage detection line RC filter circuit 220.
Figure 5:
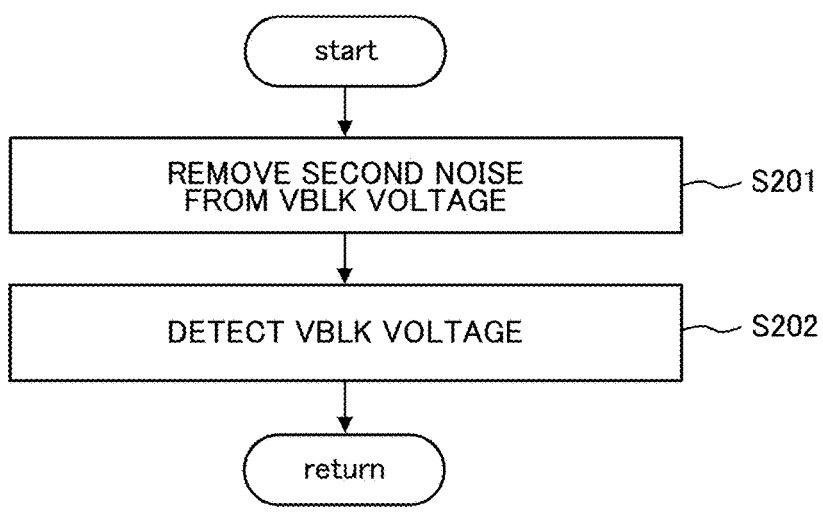
FIG. 5 is a flowchart explaining a process content of noise removal by a VBLK voltage line RC filter circuit 240.
Figure 6:
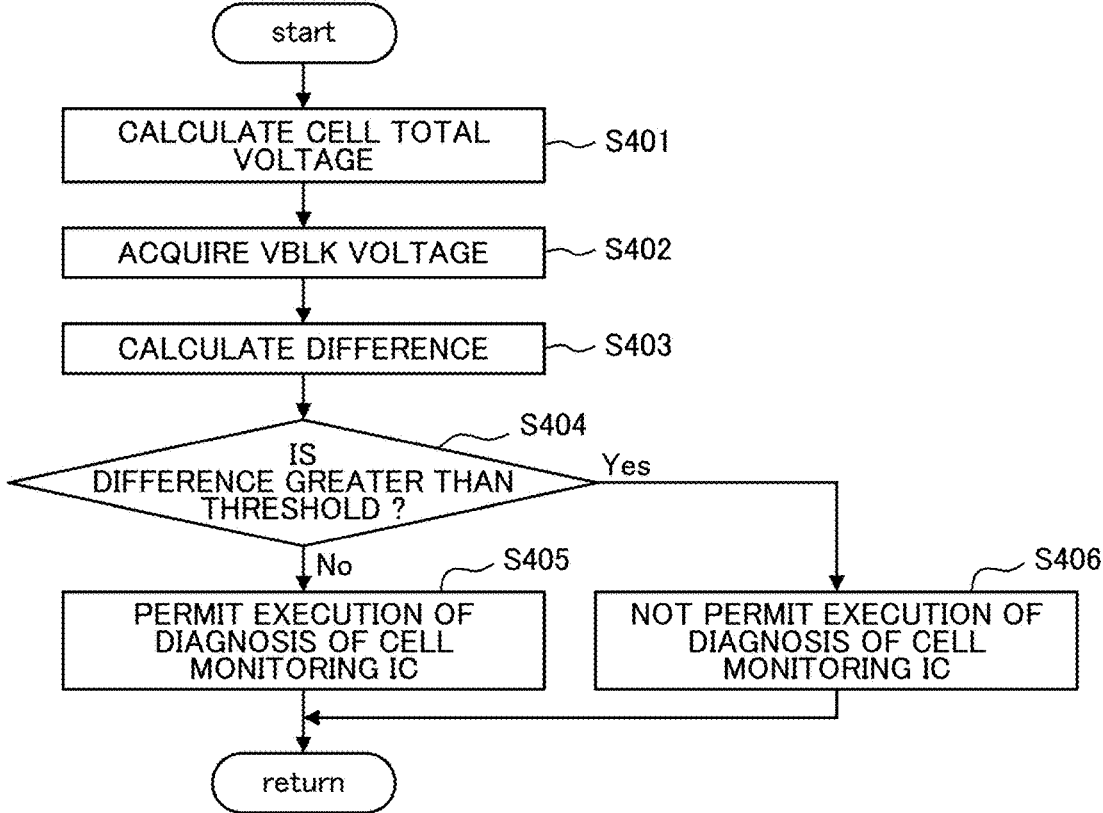
FIG. 6 is a flowchart for determining whether or not diagnosis by a cell monitoring IC may be executed.

FIG. 3 is a function block diagram explaining the internal function of the cell monitoring IC, FIG. 4 is a flowchart explaining a process content of noise removal by the cell voltage detection line RC filter circuit 220, FIG. 5 is a flowchart explaining a process content of noise removal by the VBLK voltage line RC filter circuit 240, and FIG. 6 is a flowchart for determining whether or not diagnosis by the cell monitoring IC may be executed.

First, as illustrated in FIG. 4, the first noise is removed from the voltage of each single cell 101 respectively by the cell voltage detection line RC filter circuit 220 (S101). The cell voltage of each single cell 101 after removing the first noise is inputted to the cell monitoring IC 300 from the CV terminal. Also, the cell voltage of each single cell 101 is detected respectively by the cell voltage detection unit 310 of the cell monitoring IC 300 (S102).

Also, as illustrated in FIG. 5, the second noise is removed from the VBLK voltage by the VBLK voltage line RC filter circuit 240 of the VBLK voltage line 205 (S201). The VBLK voltage where the second noise has been removed is inputted to the cell monitoring IC 300 from the VBLK terminal. Also, the VBLK voltage is detected by the cell voltage detection unit 310 of the cell monitoring IC 300 (S202).

Also, as illustrated in FIG. 3, as internal functions, the cell monitoring IC 300 includes a cell total voltage calculation unit (total voltage calculation unit) 341, a VBLK voltage measurement unit (series voltage measurement unit) 342, a diagnosis permission determination unit 343, and a cell monitoring IC diagnosis unit (cell monitoring diagnosis unit) 344. The cell total voltage calculation unit 341 totals the cell voltage of each single cell where the first noise has been removed and calculates the cell total voltage in the cell group 102 to which the cell monitoring IC 300 corresponds (S401).

Also, the VBLK voltage measurement unit 342 measures the VBLK voltage that is inputted to the cell monitoring IC 300 from the VBLK terminal, the second noise having been removed in the VBLK voltage (S402). Also, the order of calculation of the cell total voltage of step S401 and measurement of the VBLK voltage of strep S402 may be reversed and may be simultaneous.

The diagnosis permission determination unit 343 calculates the difference ΔV of the cell total voltage where the first noise has been removed and the VBLK voltage where the second noise has been removed by the expression (4) described above (S403). Also, the difference ΔV and the difference threshold (specified value) Vth set beforehand are compared (S404), when the difference ΔV is greater than the difference threshold Vth (YES in S404), it is determined that the low frequency ripple noise has been applied, diagnosis by the cell monitoring IC 300 is masked, and execution of the diagnosis by the cell monitoring IC diagnosis unit 344 is not permitted (S406). On the other hand, when the difference ΔV is equal to or less than the difference threshold Vth (NO in S404), it is determined that the low frequency ripple noise has not been applied, and execution of the diagnosis by the cell monitoring IC diagnosis unit 344 is permitted (S405). The cell monitoring IC diagnosis unit 344 executes diagnosis when the diagnosis permission determination unit 343 permits execution of the diagnosis, and does not execute diagnosis when the diagnosis permission determination unit 343 masks the diagnosis.

For example, if the difference threshold Vth of the cell total voltage and the VBLK voltage is made 50 mV, when the difference ΔV of the cell total voltage and the VBLK voltage is greater than 50 mV, it is determined that the low frequency ripple noise has been applied, diagnosis of the cell monitoring IC 300 where impact of the low frequency ripple noise is large is masked, namely the diagnosis is not executed. On the other hand, when the difference ΔV of the cell total voltage and the VBLK voltage is equal to or less than the threshold 50 mV, it is determined that the low frequency ripple noise has not been applied, and the diagnosis is executed.

For example, it is possible that the ripple noise superposed to the cell voltage caused by operation of the inverter 700 is applied. Although the high frequency ripple noise can be suppressed by the RC filter and the like, the effect of the RC filter is small for the low frequency ripple noise, and it is hard to suppress the low frequency ripple noise. According to the battery system monitoring device 100 of the present embodiment, whether or not the cell monitoring IC 300 is in a state of being applied with the low frequency ripple noise can be grasped precisely, and therefore the noise control measures considering possibility of application of the noise can be taken in the diagnosis by the cell monitoring IC 300. For example, when the low frequency ripple noise has been applied, the diagnosis by the cell monitoring IC 300 can be masked. Therefore, in the diagnosis by the cell monitoring IC 300, the impact of the noise can be excluded, and the diagnosis accuracy can be improved.

Although explanation was made with an example of the case of using the cell voltage detection line and the VBLK voltage line 205 according to the embodiment described above, the cell voltage can be measured also in the cell discharge line. It is also possible to use the measured voltage of the cell discharge line and the VBLK voltage line. That is to say, the first noise contained in the discharging voltage of the plural number of the single cells 101 is removed by the cell voltage discharge line RC filter circuit 230 on the basis of the first time constant, and the discharging voltage of the plural number of the single cells 101 where the noise has been removed is totaled by the cell monitoring IC 300 to calculate the total voltage. Also, the noise contained in the VBLK voltage is removed by the cell voltage detection line RC filter circuit 220 on the basis of the second time constant, and the VBLK voltage where the noise has been removed is measured by the VBLK voltage measurement unit 342. Further, it may be configured also that whether or not diagnosis of a state of the plural number of the single cells 101 is to be permitted is determined on the basis of the total voltage and the VBLK voltage, and when it has been determined that the diagnosis may be executed, diagnosis of the state of the plural number of the single cells 101 is executed.

Each of the embodiments and the modifications explained above is only an example, and the present disclosure is not to be limited to the content of them as far as the feature of the disclosure is not impaired. For example, the embodiments described above were explained in detail for easy understanding of the present disclosure, and are not to be necessarily limited to one including all configurations having been explained. Also, a part of a configuration of an embodiment can be substituted by a configuration of other embodiments, and a configuration of an embodiment can be added with a configuration of other embodiments. Also, with respect to a part of a configuration of each embodiment, it is possible to effect addition, deletion, and substitution of other configurations.

REFERENCE SIGNS LIST

10 . . . HEV drive system,
100 . . . battery system monitoring device,
101 . . . single cell,
102 . . . cell group,
103 . . . battery pack,
200 . . . cell controller,
201 . . . cell voltage detection and discharge line CL,
202 . . . cell voltage detection line SL,
203 . . . cell voltage discharge line BL,
204 . . . power supply line PL,
205 . . . VBLK voltage line,
206 . . . GND line GL,
211 . . . VBLK voltage line input resistance,
212 . . . VBLK voltage line input condenser,
220 . . . cell voltage detection line RC filter circuit (first noise removal unit),
221 . . . cell input resistance Rcv,
222 . . . cell input condenser Ccv,
230 . . . cell voltage discharge line RC filter circuit,
231 . . . balancing resistance Rbs,
232 . . . balancing condenser Cbs,
240 . . . VBLK voltage line RC filter circuit (second noise removal unit),
300 . . . cell monitoring IC,
341 . . . cell total voltage calculation unit (total voltage calculation unit),
342 . . . VBLK voltage measurement unit (series voltage measurement unit),
343 . . . diagnosis permission determination unit,
344 . . . cell monitoring IC diagnosis unit (cell monitoring diagnosis unit), 400 . . . insulation element group,
500 . . . battery controller,
700 . . . inverter,
800 . . . motor

The invention claimed is:

1. A battery system monitoring device for monitoring a state of a plurality of single cells connected in series, the battery system monitoring device comprising:
   a first filter circuit configured to remove a first noise contained in a voltage of the plurality of single cells of based on a first time constant;
   a second filter circuit configured to remove a second noise contained in a series voltage that is a voltage between a positive electrode of the highest single cell connected in series of the plurality of single cells and a negative electrode of the lowest single cell based on a second time constant; and
   processing circuitry configured to:
      calculate a total voltage by totaling the voltage of the plurality of single cells where the first noise has been removed by the first filter circuit;
      measure the series voltage where the second noise has been removed by the second filter circuit;
      determine, based on the total voltage calculated by the processing circuitry and the series voltage measured by the processing circuitry, whether or not diagnosis of a state of the plurality of single cells is to be permitted; and
      execute the diagnosis of the state of the plurality of single cells in response to a determination that the diagnosis may be executed by the processing circuitry.

2. The battery system monitoring device according to claim 1, wherein
   the processing circuitry is configured to determine whether or not the diagnosis of the state of the plurality of single cells is to be permitted to based on whether or not a difference of the total voltage calculated by the processing circuitry and the series voltage measured by the processing circuitry is greater than a threshold that is predetermined.

3. The battery system monitoring device according to claim 2, wherein
   the processing circuitry is configured to:
   prevent the diagnosis in response to a determination that the difference is greater than the threshold, and
   permit the diagnosis in response to a determination that the difference is equal to or less than the threshold.

4. The battery system monitoring device according to claim 1, wherein
   the voltage of the plurality of single cells is a cell voltage.

5. The battery system monitoring device according to claim 1, wherein
   the voltage of the plurality of single cells is a discharging voltage.

* * * * *